(12) United States Patent
Yang et al.

(10) Patent No.: US 9,723,740 B2
(45) Date of Patent: Aug. 1, 2017

(54) ELECTRONIC CONTROL APPARATUS FOR VEHICLE

(71) Applicant: Hyundai Autron Co., Ltd., Seongnam-si (KR)

(72) Inventors: Sun Jae Yang, Gunpo-si (KR); Hyung Joon Moon, Seoul (KR); Chang Geun Shin, Yongin-si (KR); Dong Gi Lee, Incheon (KR); Jun Ho Lee, Seoul (KR)

( * ) Notice: Subject to any disclaimer, the term of this patent is extended or adjusted under 35 U.S.C. 154(b) by 0 days.

(21) Appl. No.: 14/139,854

(22) Filed: Dec. 23, 2013

(65) Prior Publication Data

US 2014/0334115 A1   Nov. 13, 2014

(30) Foreign Application Priority Data

May 10, 2013 (KR) .................. 10-2013-0053181

(51) Int. Cl.
| | |
|---|---|
| *H05K 7/14* | (2006.01) |
| *H05K 5/06* | (2006.01) |
| *B60R 16/023* | (2006.01) |
| *H05K 5/00* | (2006.01) |

(52) U.S. Cl.
CPC .......... *H05K 5/063* (2013.01); *B60R 16/023* (2013.01); *B60R 16/0238* (2013.01); *B60R 16/0239* (2013.01); *H05K 5/0052* (2013.01); *H05K 5/061* (2013.01); *H05K 7/1427* (2013.01)

(58) Field of Classification Search
CPC .............. H05K 7/1427–7/1434; H05K 5/0052
USPC ....................................... 248/27.1
See application file for complete search history.

(56) References Cited

U.S. PATENT DOCUMENTS

| | | | | |
|---|---|---|---|---|
| 6,296,336 | B1 * | 10/2001 | Hattori ................... | H05K 5/061 220/378 |
| 6,407,925 | B1 * | 6/2002 | Kobayashi ........... | H05K 5/0052 200/61.88 |
| 7,561,435 | B2 * | 7/2009 | Kamoshida ............ | H05K 5/062 174/50.5 |

(Continued)

FOREIGN PATENT DOCUMENTS

| | | |
|---|---|---|
| CN | 102833970 A | 12/2012 |
| DE | EP 0717588 A2 * | 6/1996 ......... B60R 16/0239 |

(Continued)

OTHER PUBLICATIONS

Office Action, Korea Intellectual Property Office, May 1, 2014.

(Continued)

*Primary Examiner* — Zachary M Pape
*Assistant Examiner* — Douglas Burtner
(74) *Attorney, Agent, or Firm* — Mayer Brown LLP; Hyunho Park

(57) ABSTRACT

The present disclosure relates to an electronic control apparatus for a vehicle, and the electronic control apparatus of the present disclosure includes: an electronic control element which includes an electronic control board which electrically controls each part of a vehicle, and a heating element which is positioned on a surface of the electronic control board; a cover and a base which accommodate the electronic control element; and a connector which is coupled to the electronic control element, in which an edge part where the cover and the base come into contact with each other is configured in a multi-step bent shape.

6 Claims, 5 Drawing Sheets

(56) References Cited

U.S. PATENT DOCUMENTS

| | | | | |
|---|---|---|---|---|
| 7,563,992 | B2 * | 7/2009 | Lawlyes | H05K 9/0073 174/561 |
| 7,570,496 | B2 * | 8/2009 | Chen | H05K 9/0073 174/350 |
| 8,053,669 | B1 * | 11/2011 | Sodini | B60R 16/0238 174/59 |
| 8,139,376 | B2 * | 3/2012 | Sanroma | H05K 5/061 174/350 |
| 8,305,763 | B2 * | 11/2012 | Kato | H05K 5/006 361/730 |
| 2003/0025393 | A1 * | 2/2003 | Mayer | H05K 5/061 307/9.1 |
| 2005/0111166 | A1 * | 5/2005 | Kita | B60R 16/0239 361/624 |
| 2007/0230137 | A1 * | 10/2007 | Inagaki | B60R 16/0239 361/719 |
| 2007/0230143 | A1 * | 10/2007 | Inagaki | B60R 16/0239 361/752 |
| 2010/0103632 | A1 | 4/2010 | Kato | |
| 2010/0208933 | A1 * | 8/2010 | Lee | B29C 45/14065 381/394 |
| 2010/0259901 | A1 * | 10/2010 | Sanroma | H05K 5/061 361/720 |
| 2010/0271791 | A1 * | 10/2010 | Loibl | B60R 16/0239 361/760 |
| 2010/0307814 | A1 * | 12/2010 | Aoki | B60R 16/0238 174/520 |
| 2011/0114354 | A1 * | 5/2011 | Heien | B60R 16/0238 174/50.5 |
| 2011/0259890 | A1 * | 10/2011 | Hsu | H05K 5/061 220/324 |
| 2012/0002381 | A1 * | 1/2012 | Zanoni | H05K 1/144 361/752 |
| 2012/0073851 | A1 * | 3/2012 | Takeuchi | B60R 16/0239 174/50.51 |
| 2012/0085766 | A1 * | 4/2012 | I | H02G 3/088 220/378 |
| 2012/0091154 | A1 * | 4/2012 | Satoh | B60R 16/0238 220/660 |
| 2012/0320544 | A1 * | 12/2012 | Ohhashi | H05K 5/0052 361/752 |
| 2013/0215582 | A1 * | 8/2013 | Dittrich | H05K 5/061 361/752 |
| 2014/0076772 | A1 * | 3/2014 | Azumi | H05K 5/069 206/706 |
| 2015/0029686 | A1 * | 1/2015 | Shimizu | H02G 3/16 361/752 |

FOREIGN PATENT DOCUMENTS

| | | | | |
|---|---|---|---|---|
| JP | 2012185816 A | * | 9/2012 | ........... G06F 1/1643 |
| JP | 2014060307 A | * | 4/2014 | ............. H05K 5/069 |
| KR | 10-2004-0071887 A | | 4/2008 | |

OTHER PUBLICATIONS

State Intellectual Property Office of the P.R.C., Office Action for Chinese patent application No. 201310703716.3, Jun. 2, 2016, China.

* cited by examiner

ELECTRONIC CONTROL APPARATUS FOR VEHICLE

CROSS-REFERENCE TO RELATED APPLICATIONS

This application is based on and claims priority from Korean Patent Application No. 10-2013-0053181, filed on May 10, 2013, the disclosure of which is incorporated herein in its entirety by reference.

TECHNICAL FIELD

The present disclosure relates to an electronic control apparatus for a vehicle, and more particularly, to an electronic control apparatus which is an electronic control apparatus such as an engine electronic control unit (ECU) for a vehicle and has high rigidity and a waterproof structure.

BACKGROUND

In general, an electronic control apparatus such as an ECU, which electronically controls various types of devices, is equipped in a vehicle. The electronic control apparatus receives information from sensors or switches that are installed at each part of the vehicle. The electronic control apparatus serves to perform various electronic controls for promoting improvement of a riding quality and safety of the vehicle or providing various items of convenience to a driver and a passenger by processing the received information.

For example, the electronic control apparatus such as the ECU, which controls states of an engine, an automatic transmission, an anti-lock brake system (ABS), and the like in the vehicle using a computer, also serves to control all parts in the vehicle, such as a driving system, a braking system, and a steering system as well as the automatic transmission as the vehicle and the computer have been developed in terms of performance.

The electronic control apparatus such as the ECU has a structure that includes a case which includes an upper cover and a lower base, a printed circuit board (PCB) which is accommodated in the case, a connector which is coupled to a front end of the PCB so as to be connected to an external socket, and the like.

The cover and the base are assembled together with the PCB while covering the PCB, and particularly, the connector, which is interposed between the cover and the base when the cover and the base are assembled, forms a sealing structure with the cover side and the base side.

Heating elements are provided on a top side of the PCB, and a heat radiating paste is attached to a bottom side of the PCB. The cover and the base are fastened by a screw.

The electronic control apparatus includes a high integrated control circuit means and thus requires a predetermined sealing structure that may prevent external moisture or foreign substances from flowing into the electronic control apparatus, and the electronic control apparatus adopts a sealing structure in which the cover and the base are typically assembled together with the connector in a state in which sealing materials are inserted on binding parts between the cover and the base and the connector so as to protect the PCB and the like in the electronic control apparatus.

Meanwhile, the electronic control apparatus is equipped in the vehicle, and thus, a housing may be damaged due to external impact in accordance with a vehicle driving state or environment. A number of screws are used to couple the cover and the housing because the structure coupled by screws may be loosened, and thus, manufacturing costs are increased, and efficiency of manufacturing processes deteriorates.

In a case in which a coupling relationship between the cover and the base of the housing is loosened, or a crack is formed in a coupling portion, an internal circuit may be damaged due to an inflow of moisture, and the vehicle may be abnormally operated at the time of driving the vehicle.

SUMMARY

The present disclosure has been made in an effort to provide an electronic control apparatus for a vehicle having a coupling structure between a cover and a base, which has excellent rigidity and durability, and may prevent external moisture or foreign substances from flowing into the electronic control apparatus.

The present disclosure has been made in an effort to provide an electronic control apparatus for a vehicle having a coupling structure between a cover and a base, which may reduce the number of screws that are required to couple the cover and the housing, and may be manufactured by a simple process.

An exemplary embodiment of the present disclosure provides an electronic control apparatus for a vehicle, including: an electronic control element which includes an electronic control board which electrically controls each part of a vehicle, and a heating element which is positioned on a surface of the electronic control board; a cover and a base which accommodate the electronic control element; and a connector which is coupled to the electronic control element, in which an edge part where the cover and the base come into contact with each other is configured in a multi-step bent shape.

The cover and the base may have a protruding portion and a groove portion that accommodates the protruding portion, and the protruding portion and the groove portion may be formed at a front side of the edge part having the multi-step bent shape so as to correspond to each other.

A sealing member may be inserted between the protruding portion and the groove portion.

Another exemplary embodiment of the present disclosure provides an electronic control apparatus for a vehicle, including: an electronic control element which includes an electronic control board which electrically controls each part of a vehicle, and a heating element which is positioned on a surface of the electronic control board; a cover and a base which accommodate the electronic control element; and a connector which is coupled to the electronic control element, in which contact surfaces where the cover and the base come into contact with each other include first contact surfaces which have a groove portion and a protruding portion that are formed at the cover and the base, respectively, and second contact surfaces having a multi-step bent shape which are continuous with the first contact surfaces.

A sealing member may be included between the first contact surfaces of the cover and the base.

Yet another exemplary embodiment of the present disclosure provides an electronic control apparatus for a vehicle, including: an electronic control element which includes an electronic control board which electrically controls each part of a vehicle, and a heating element which is positioned on a surface of the electronic control board; a cover and a base which accommodate the electronic control element; and a connector which is coupled to the electronic control element, in which contact surfaces where the cover and the base come into contact with each other include first contact surfaces which have a protruding portion and a groove portion that are formed at the cover and the base, respectively, and second contact surfaces having a multi-step bent shape which are continuous with the first contact surfaces.

A sealing member is included between the first contact surfaces of the cover and the base.

According to the exemplary embodiment of the present disclosure, rigidity and durability of the electronic control apparatus may be improved, and external moisture or foreign substances may be prevented from flowing into the electronic control apparatus.

When the electronic control apparatus is manufactured, the number of screws that are required to couple the cover and the housing may be reduced, and a manufacturing process may be further simplified.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
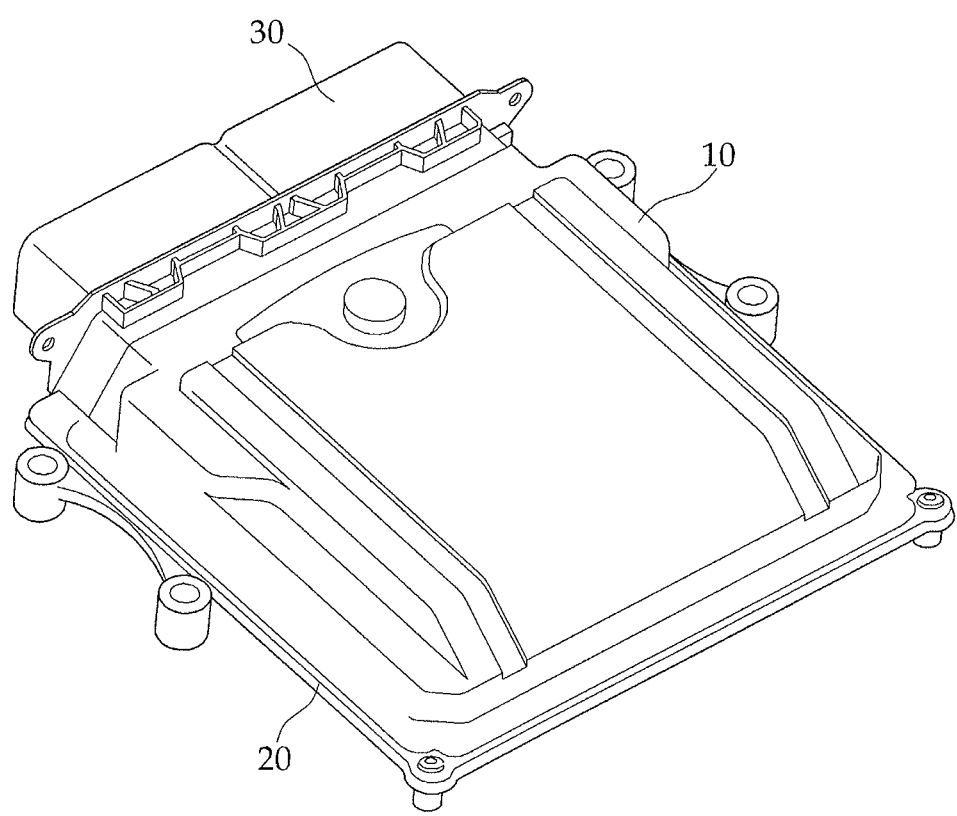
FIG. 1 is a coupled perspective view of an electronic control apparatus for a vehicle according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, an exemplary embodiment according to the present disclosure will be described in detail with reference to the accompanying drawings. A configuration of the present disclosure and an operation and an effect according to the configuration of the present disclosure will be clearly understood by the detailed description below. In the following description, the same elements will be designated by the same reference numerals although the elements are illustrated in different drawings, and a detailed explanation of publicly known related configurations may be omitted so as to avoid unnecessarily obscuring the subject matter of the present disclosure.

FIG. 1 is a coupled perspective view of an electronic control apparatus for a vehicle according to an exemplary embodiment of the present disclosure.

As illustrated, the electronic control apparatus refers to a component having an electronic control element, for example, integrated control circuit means, such as a printed circuit board (PCB), which electrically controls each part of a vehicle, and requires a tight sealing structure so as to prevent external moisture or foreign substances from flowing into the electronic control apparatus.

To this end, a cover 10 and a base 20, which are combined with each other in an up and down direction while accommodating a board such as the PCB therein, are provided, and a connector 30 is coupled to front portions of the cover 10 and the base 20 which are combined as described above. The connector 30 is coupled together with the cover 10 and the base 20 while being interposed between the cover 10 and the base 20 through a rear end body portion when the cover 10 and the base 20 are coupled to each other in the up and down direction.

As illustrated in FIG. 1, the electronic control apparatus refers to the component having the electronic control element, for example, integrated control circuit means, such as the PCB with electronic components installed on a surface of the PCB, which electrically controls each part of the vehicle. The electronic control apparatus requires a heat radiating structure for radiating heat, which is generated from the electronic components such as capacitors mounted on the PCB, to the outside of the electronic control apparatus. The electronic control apparatus requires a sealing structure for preventing external moisture or foreign substances from flowing into the electronic control apparatus.

Figure 2:
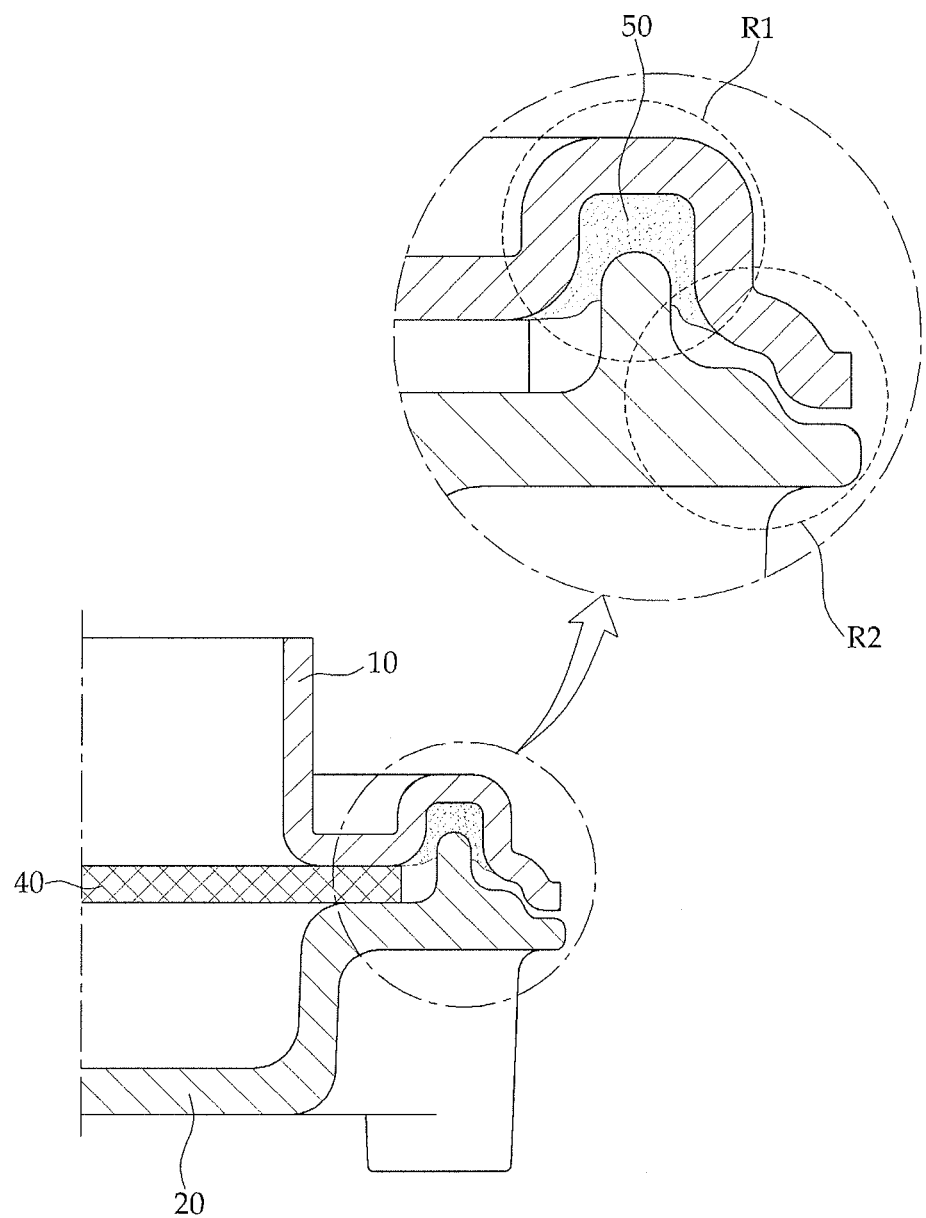
FIG. 2 is a cross-sectional view illustrating the electronic control apparatus for a vehicle according to the exemplary embodiment of the present disclosure.

FIG. 2 is a cross-sectional view illustrating the electronic control apparatus for a vehicle according to the exemplary embodiment of the present disclosure.

As illustrated, an electronic control element is mounted between the cover 10 and the base 20. The electronic control element includes a PCB 40 and heating elements which are positioned on one or both surface of the PCB. The electronic control element controls electrically each part of the vehicle.

Although not illustrated, in order for the heating elements to radiate heat, a heat radiating plate is attached to the other surface of the PCB, which is opposite to the a surface portion on which the heating elements are positioned. Here, the heating elements may be positioned at a top side or a bottom side of the PCB. In a case in which the heating elements are positioned at the top side of the PCB, the heat radiating plate is attached to the bottom side of the PCB. On the contrary, in a case in which the heating elements are positioned at the bottom side of the PCB, the heat radiating plate is attached to the top side of the PCB.

The connector 30 has a connector pin, and is coupled to the electronic control element.

The cover 10 and the base 20 form a predetermined space so as to accommodate the PCB and various types of components in the space, and end portions of the cover 10 and the base 20 come into contact with each other. In this case, the end portions of the cover 10 and the base 20 form a predetermined gap so that the PCB 40 may be mounted between the cover 10 and the base 20, and have curved shapes so that surfaces of the end portions correspond to each other. The cover 10 and the base 20 extend from surfaces on which the PCB is mounted, and a binding part R1, which is formed by a groove portion and a protruding portion, is formed. The protruding portion and the groove portion, which accommodates the protruding portion, are configured in concave and convex shapes so as to correspond to each other.

A sealing member 50 is inserted or applied between the protruding portion and the groove portion of the binding part R1. The sealing member 50 is inserted or applied between the protruding portion and the groove portion, thereby improving an effect of tightly binding the cover 10 and the base 20, and improving a waterproof effect.

An edge part R2, which extends from the binding part R1, is configured in a multi-step bent shape, while the cover 10 and the base 20 come into contact with each other so as to correspond to each other. As illustrated, the multi-step bent shape may be a two-step bent shape that is formed by bending an end portion of the region R1 and an intermediate portion of the region R2, but the number of bending times may be more than two.

Therefore, the existing housing formed by coupling a cover and a base is relatively vulnerable to deformation such as bending as a length of the existing housing is increased, but the structure of the present exemplary embodiment in which an outer portion of the housing is multi-step bent may relatively reinforce strength.

Figure 3:
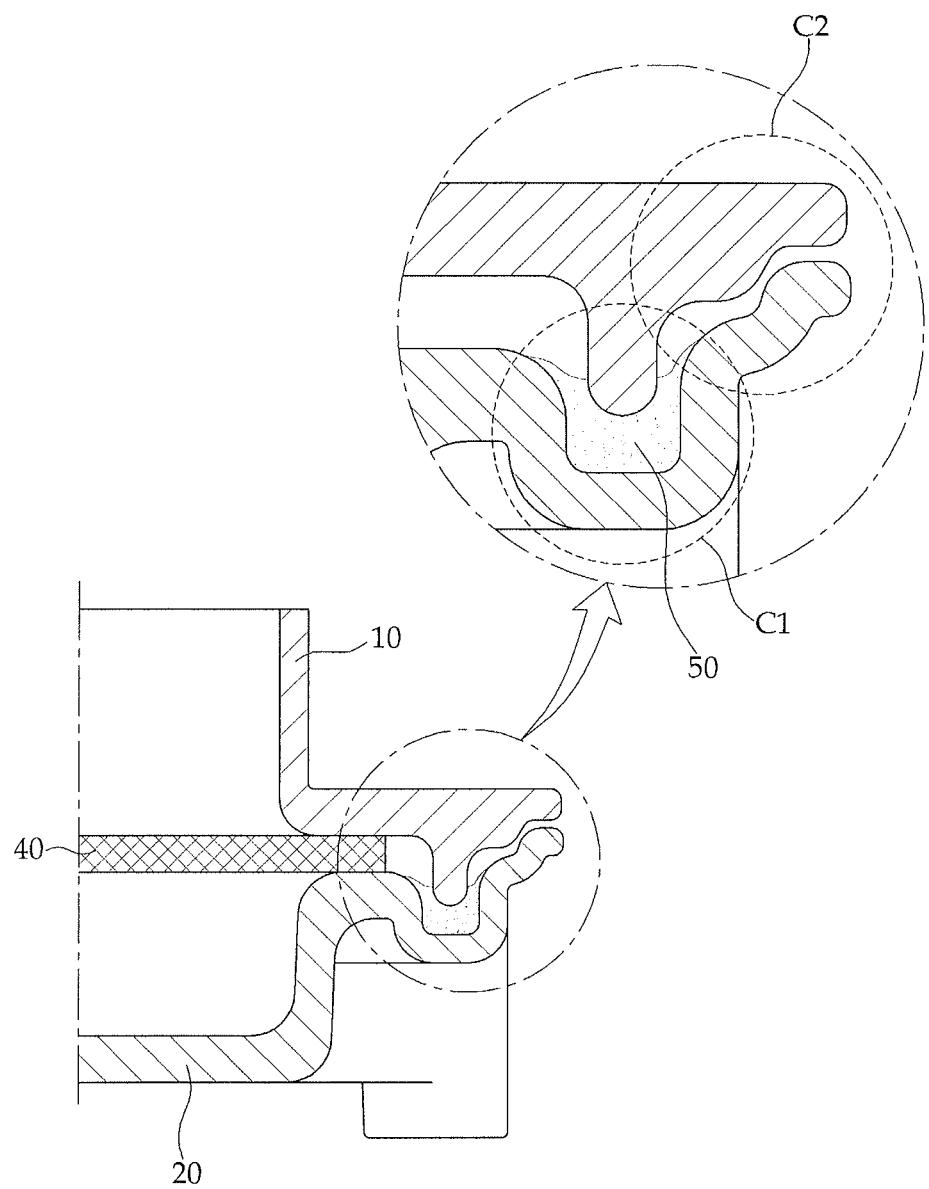
FIG. 3 is a cross-sectional view illustrating an electronic control apparatus for a vehicle according to another exemplary embodiment of the present disclosure.

FIG. 3 is a cross-sectional view illustrating an electronic control apparatus for a vehicle according to another exemplary embodiment of the present disclosure.

A structure of the exemplary embodiment illustrated in FIG. 3 is basically identical to the structure of the exemplary embodiment that has been described with reference to FIG. 2. A cover 10 and a base 20 extend from surfaces on which a PCB 40 is mounted so as to form a binding part C1 having a protruding portion and a groove portion that accommodates the protruding portion, and the protruding portion and the groove portion form concave and convex shapes that correspond to each other. The binding part C1 has a shape in which the concave and convex shapes are turned over in comparison with the binding part R1 illustrated in FIG. 2. A sealing member 50 is inserted or applied between the protruding portion and the groove portion of the binding part C1, thereby improving an effect of tightly binding the cover 10 and the base 20, and improving a waterproof effect.

Likewise, an edge part C2, which extends from the binding part C1, is configured in a multi-step bent shape, while the cover 10 and the base 20 come into contact with each other so as to correspond to each other. As illustrated, the multi-step bent shape may be a two-step bent shape that is formed by bending an end portion of the region C1 and an intermediate portion of the region C2, but the number of bending times may be more than two, and in some cases, a shape (opposite to the illustrated shape), which is bent toward the base 20, may be formed.

Therefore, the existing housing formed by coupling a cover and a base is relatively vulnerable to deformation such as bending as a length of the existing housing is increased, but the structure of the present exemplary embodiment in which an outer portion of the housing is multi-step bent may relatively reinforce strength.

In a process of manufacturing the electronic control apparatus, the electronic control element, which has the PCB, which electrically controls each part of the vehicle, and the heating elements which is positioned on a surface of the PCB, and the connector having the connector pin are coupled.

The heat radiating plate (for example, a metallic material or a heat radiating pad) is attached to the bottom side of the PCB which is opposite to the top side at which the heating elements are positioned.

Thereafter, the electronic control element is inserted between the cover 10 and the base 20, and the necessary number of screws is fastened at the end portions of the cover 10 and the base 20.

Meanwhile, the existing housing formed by coupling a cover and a base is relatively vulnerable to deformation such as bending as a length of the existing housing is increased, and thus, the number of fastening screws is increased in order to resolve the vulnerability. However, like the present disclosure, when the multi-step bent structure in which the outer portion of the housing is bent two or more times is adopted, strength of the housing may be reinforced, thereby reducing the number of fastening screws. In the case of a waterproof type, water inflow caused by high-pressure cleaning may be prevented.

Figure 4A:
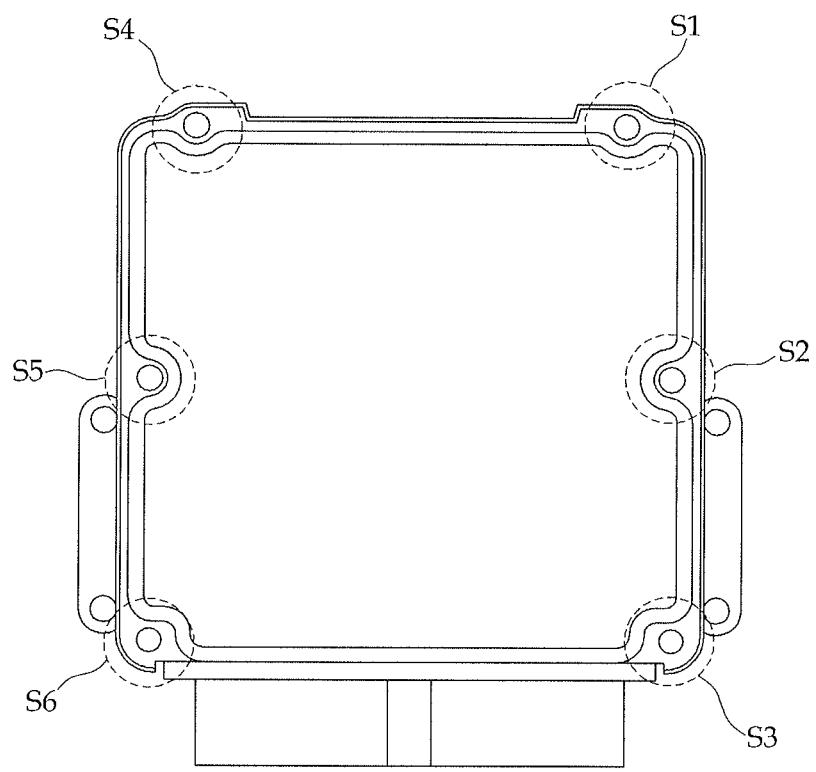
FIG. 4A is a bottom view of the electronic control apparatus to which a coupling structure of the related art is applied.
Figure 4B:
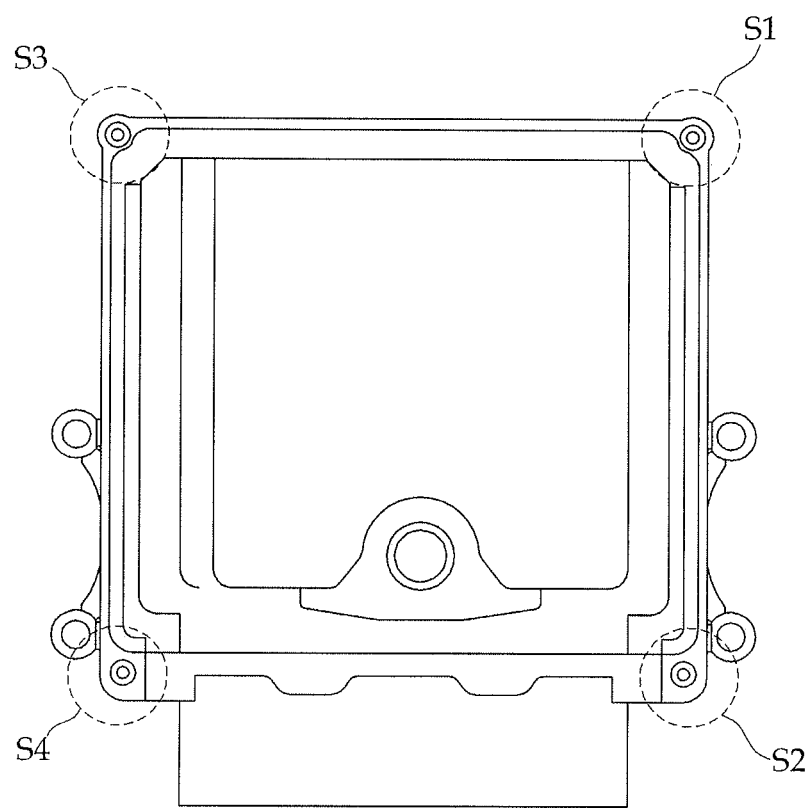
FIG. 4B is a bottom view of the electronic control apparatus to which a coupling structure of the present disclosure is applied.

FIG. 4A is a bottom view of an electronic control apparatus to which a coupling structure in the related art is applied, and FIG. 4B is a bottom view of the electronic control apparatus to which the coupling structure of the present disclosure is applied.

Referring to FIG. 4A and FIG. 4B, in FIG. 4A, six screws S1, S2, S3, S4, S5 and S6 are required to fasten the housing in the related art, but in FIG. 4B when the coupling structure of the present disclosure is applied, the cover and the housing may be fastened by only four screws S1, S2, S3 and S4.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An electronic control apparatus for a vehicle, comprising:
    an electronic control element which includes a printed circuit board (PCB) and a heating element installed on a surface of the PCB;
    a cover and a base which accommodate the electronic control element; and
    a connector which is coupled to the electronic control element,
    wherein contact surfaces of the electronic control apparatus where the cover and the base come into contact with each other comprise a binding part having a groove portion and a protruding portion that are formed toward an outer edge of the cover and the base, respectively, and an edge part having a multi-step bent shape, the multi-step bent shape formed by bending an end portion of the binding part and an intermediate portion of the edge part,
    wherein an end of the edge part having the multi-step bent shape extends away from the PCB and a multi-step of the multi-step bent shape continually steps down toward the outer edge of the cover and the base, such that a sealing member is inserted in a channel between the cover and the base that extends away from the PCB along with the multi-step bent shape toward the outer edge of the cover and the base,
    wherein an edge of the PCB is inserted in the channel such that the PCB directly contacts and is sandwiched between the cover and the base.

2. The electronic control apparatus of claim 1, wherein the sealing member is inserted between the protruding portion and the groove portion of the binding part.

3. The electronic control apparatus of claim 1, wherein the edge part is extended from the binding part to the outer edge of the contact surfaces.

4. The electronic control apparatus of claim 3, wherein the sealing member is included between the cover and the base at the binding part.

5. An electronic control apparatus for a vehicle, comprising:
- an electronic control element which includes an electronic control board which electrically controls each part of a vehicle, and a heating element which is positioned on a surface of the electronic control board;
- a cover and a base which accommodate the electronic control element; and
- a connector which is coupled to the electronic control element,
- wherein contact surfaces of the electronic control apparatus where the cover and the base come into contact with each other include a binding part which have a protruding portion and a groove portion that are formed at the cover and the base, respectively, and an edge part having a multi-step bent shape, the edge part is extended from the binding part to the outer edge of the contact surfaces, the multi-step bent shape formed by bending an end portion of the binding part and an intermediate portion of the edge part,
- wherein an end of the edge part having the multi-step bent shape extends away from the PCB and a multi-step of the multi-step bent shape continually steps down toward the outer edge of the cover and the base, such that a sealing member is inserted in a channel between the cover and the base that extends away from the PCB along with the multi-step bent shape toward the outer edge of the cover and the base,
- wherein an edge of the PCB is inserted in the channel such that the PCB directly contacts and is sandwiched between the cover and the base.

6. The electronic control apparatus of claim 5, wherein the sealing member is included between the cover and the base at the binding part.

* * * * *